Feb. 22, 1966 P. W. McMILLAN ETAL 3,236,610

BONDED METAL-CERAMIC ELEMENTS

Filed March 5, 1962

Inventors:
Peter William McMillan
Brian Purdom Hodgson
By Stevens, Davis, Miller & Mosher
Attorneys United States Patent Office 3,236,610

Patented Feb. 22, 1966

3,236,610
BONDED METAL-CERAMIC ELEMENTS

Peter William McMillan and Brian Purdam Hodgson, Stafford, England, assignors to The English Electric Company Limited, London, England, a British company Filed Mar. 5, 1962, Ser. No. 177,417
Claims priority, application Great Britain, Mar. 10, 1961, 8,791/61
5 Claims. (Cl. 29—195)

This invention relates to bonded metal-ceramic elements. Such elements are used, for example, to form printed circuit panels.

According to one aspect of this invention, a process for the manufacture of a bonded metal-ceramic element comprises bonding a metal component to a component of a glass capable of controlled devitrification, and then subjecting the element to a heat treatment so as to convert the glass into a predominantly crystalline ceramic material.

According to another aspect of this invention a bonded metal-ceramic element comprises a metal component bonded to a devitrified glass component.

According to yet another aspect of the invention, a printed circuit panel is made from a bonded metal-ceramic element as referred to in the preceding paragraph.

The term "printed circuit" is well-known in the art, and does not imply that a printing operation is employed; the desired pattern of electrical connections may for example be formed by resist etching of an electrical conducting material which initially covers an insulating base.

In a preferred embodiment of the invention, the thermally-devitrifiable glass component is bonded to a copper or a silver foil by a hot pressing operation.

A bonded metal-ceramic element manufactured in accordance with the invention possesses a number of advantages when formed into a printed circuit panel, as compared with commonly-used printed circuit panels having their bases formed of organic bonded laminates.

Examples of methods of manufacturing a metal-ceramic element in accordance with the invention will now be described with reference to the accompanying drawings, of which:

A preferred range of compositions of thermally-devitrifiable glasses suitable for use in connection with the present invention is as follows:

| | Percent by weight |
|---|---|
| $SiO_2$ | 50–80 |
| PbO | 0–30 |
| $Al_2O_3$ | 0–3 |
| ZnO | 5–30 |
| $Li_2O$ | 5–15 |
| $B_2O_3$ | 0–7 |
| $K_2O$ | 0–5 |
| $Na_2O$ | 0–5 |
| $P_2O_5$ | 1–3 |

In certain preferred compositions, PbO is present within the range 0.5 to 30 percent by weight.

In addition to their suitably for bonding to a conducting metal in accordance with the invention, certain of the compositions in the above range have coefficients of thermal expansion in the devitrified state in the range 20–400° C. of between 135 and $175 \times 10^{-7}$ which make them particularly useful when bonded to copper and silver. It will be understood that the invention is not necessarily limited to devitrifiable glasses in the above range and other devitrifiable glasses with suitable properties may be used.

Two preferred compositions have the following percentages by weight:

*Composition A*

| | |
|---|---|
| $SiO_2$ | 59.2 |
| ZnO | 27.1 |
| $Li_2O$ | 9.0 |
| $K_2O$ | 2.0 |
| $P_2O_5$ | 2.7 |

*Composition B*

| | |
|---|---|
| $SiO_2$ | 54.2 |
| ZnO | 24.4 |
| $Li_2O$ | 9.0 |
| $B_2O_3$ | 5.0 |
| $Na_2O$ | 5.0 |
| $P_2O_5$ | 2.4 |

The thermal expansion coefficients in the range 20–400° C. are $174 \times 10^{-7}$ for the ceramic material formed from Composition A and $147 \times 10^{-7}$ for that formed from Composition B. Composition A thus has a thermal expansion coefficient well matched to that of copper ($183 \times 10^{-7}$) and sufficiently well matched to that of silver ($203 \times 10^{-7}$), and Composition B has a thermal expansion coefficient sufficiently well matched to that of copper.

A further preferred composition has the following percentages by weight:

*Composition C*

| | |
|---|---|
| $SiO_2$ | 59.2 |
| PbO | 14.0 |
| ZnO | 13.1 |
| $Li_2O$ | 9.0 |
| $K_2O$ | 2.0 |
| $P_2O_5$ | 2.7 |

The thermal expansion coefficient for the ceramic material formed from the latter glass is approximately $170 \times 10^{-7}$.

Where the metal component to be bonded is of copper or silver, the bond between the metal and the ceramic base is improved by applying a thin layer of nickel to the copper or silver. The nickel layer is preferably between 0.0001 and 0.0005 inch thick though it may be, say, 0.01 inch thick, and may be applied by electroplating or, in the case where the metal is copper, by rolling a composite nickel-copper sandwich ingot down to the desired thickness.

Figure 1:
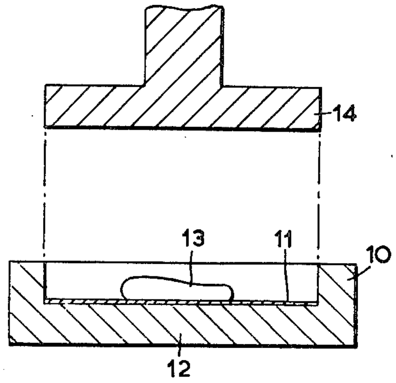
FIG. 1 shows one method in accordance with the invention.

A conducting metal component in the form of a thin metal foil is bonded to a glass plate in the following manner, reference being made to FIG. 1 of the drawings:

A sheet or cast iron mould 10 of the desired shape to give the plate the desired contour is empolyed, and the metal foil 11 is placed in the mould and pressed into close contact with the base 12 of the mould. This ensures that good heat transfer takes place between the foil 11 and the mould 10, avoiding melting of the foil which may otherwise occur when the molten glass is brough into contact with it. The thickness of the metal foil is not critical, but is preferably between 0.002 and 0.005 inch.

A charge of molten glass 13 at a temperature ranging from 1000° C. to 1300° C., depending on its composition, is dropped on to the centre of the metal foil 11 and pressed into the desired thin flat plate by means of a steel plunger 14. The bonded glass-metal plate thus formed is removed from the mould and transferred to an annealing furnace at a temperature of 450–600° C. depending on the glass composition. Speed in these operations is essential both to prevent melting or distortion of the metal foil due to prolonged contact with the molten glass and to prevent excessive chilling of the pressed glass plate due to prolonged contact with the steel plunger, which might result in cracking of the glass. A complete cycle from the introduction of the molten glass to the removal of the pressed plate from the mould should not occupy more than 60 seconds and is preferably accomplished more rapidly.

The glass-metal plate is then annealed at a temperature of 450–600° C., depending on the composition of the glass, for a period of at least 15 minutes and is then cooled, at a rate not faster than 10° C. per minute, to room temperature. At this stage the glass is transparent and may be inspected to ensure that voids and other imperfections are not present, particularly at the glass-metal interface.

The plate is then subjected to a controlled heat treatment which is carried out, where the metal foil is copper, in an atmosphere of commercial nitrogen to prevent undue oxidation of the metal. Where the metal foil is silver, the heat treatment may be carried out in air.

The heat treatment, by which the glass is converted into a predominantly crystalline ceramic material, is as follows:

(i) The temperature is raised at a rate not exceeding 10° C. per minute and preferably at a rate of 3 to 5° C. per minute to a first holding temperature which ranges from 450° C. to 600° C. depending on the glass composition;

(ii) The first holding temperature is maintained for a period of not less than 15 minutes and preferably for a period of one hour;

(iii) The temperature is then further raised at a rate not exceeding 10° C. per minute and preferably at 3 to 5° C. per minute to a second holding temperature which ranges from 700° C. to 900° C. depending on glass composition;

(iv) The second holding temperature is maintained for a period of not less than 15 minutes and preferably for one hour;

(v) The temperature is lowered to room temperature at a rate not exceeding 10° C. per minute and preferably at 5° C. per minute.

If it is not required to examine the composite plates in the glass form, the annealing process can be omitted and the plates can be transferred straight from the moulding operation to a furnace held at the first holding temperature of the heat treatment cycle. At the completion of the heat treatment there is produced a ceramic plate to one face of which the conducting metal foil is bonded. This bonded metal-ceramic element may then have its metal foil etched by means which are well-known per se to afford the desired printed circuit.

Particular examples of the method of carrying out the invention will now be described. In the first examples glass of Composition A referred to above was bonded to copper foil both of 0.001 inch thickness and 0.002 inch thickness. In each case, the piece of foil was degreased and lightly pre-oxidized on one face by heating in a gas flame to the temperature of 600–650° C. for a time not exceeding 20 seconds. By this means a very thin layer of black cupric oxide was formed on the surface of the copper. A mixture of suitable raw materials to give the desired glass composition was melted at 1300° C. in a refractory crucible containing a high proportion of zircon until the glass was homogeneous and free of bubbles. The temperature of the molten glass was then lowered to 1250° C. and it was allowed to reach equilibrium at this temperature. The pre-oxidized copper foil was placed in the bottom of a suitable steel mould and a suitable quantity of molten glass was poured on to the foil and rapidly pressed by means of a plunger. The composite glass-metal plate so formed was quickly transferred to an annealing furnace at a temperature of 480° C. This temperature was maintained for one hour and the furnace was then cooled to room temperature at a maximum rate of 5° C. per minute. After inspection the composite plate was heat-treated in a controlled atmosphere of nitrogen, to cause devitrification of the glass, as follows:

(i) The temperature was raised at a rate of 5° C. per minute to 500° C.;

(ii) The temperature of 500° C. was maintained for one hour;

(iii) The temperature was further raised at 3° C. per minute to 850° C.;

(iv) The temperature of 850° C. was maintained for one hour;

(v) The temperature was lowered to room temperature at a rate not exceeding 5° C. per minute.

It was found that the copper foil was firmly bonded to the devitrified glass plate by this process, and the bonded elements were found suitable for processing into printed circuits by the use of standard etching techniques.

In another particular example, pieces of copper foil 0.001 to 0.005 inch thick clad with a layer of nickel 0.0001 to 0.0002 inch thick by a rolling process were first degreased and then preoxidized by firing at 930° C. in "wet" nitrogen for a period of up to 5 minutes depending on the size of the foil. By this means an adherent layer of green nickel oxide was formed on the nickel surface, while the surface of the copper remained substantially free from oxide. A mixture of suitable raw materials to give glass Composition C was melted at 1300° C. in a crucible made from a refractory ceramic containing a high proportion of zircon until the glass was homogeneous and free from bubbles. The temperature of the glass was then lowered to 1250° C. and the glass was allowed to reach equilibrium at this temperature. The preoxidized foil was placed in the bottom of a suitable steel mould as shown in FIG. 1 with the nickel surface uppermost and a suitable quantity of molten glass was placed on the foil and rapidly pressed by means of a plunger. The composite metal-glass plate so formed was transferred to an annealing furnace at a temperature of 480° C. This temperature was maintained for one hour and the furnace was then cooled to room temperature at a maximum rate of 5° C. per minute. After inspection and cutting to size, the composite plate was heat-treated in a controlled atmosphere of nitrogen, to cause devitrification of the glass, as follows:

(i) The temperature was raised at a rate of 5° C. per minute to 500° C.

(ii) The temperature of 500° C. was maintained for two hours.

(iii) The temperature was further raised at 2–3° C. per minute to 725° C.

(iv) The temperature of 725° C. was maintained for one hour.

(v) The temperature was lowered to room temperature at a rate not exceeding 5° C. per minute.

It was found that the bonded metal-ceramic element thus produced showed good adhesion between the nickel-clad copper component and the devitrified glass component, the standard peel strength test giving a figure of up to 12 lb./inch. For printed circuit panels having a phenolic-resin-bonded paper base as used hitherto, a peel strength of 6 to 8 lb./inch is typical.

In the test referred to, a one inch wide strip of the foil is first peeled back over a short distance and bent at right angles to the base. An increasing load is then applied to the end of the foil, at right angles to the base, and the load required to start the foil peeling is noted, the result being expressed in lb./inch.

Pure nickel foil can also be bonded in exactly the same manner as described for the nickel-clad copper foil; the adhesion of this foil is also good, having a peel strength of approximately 10 lb./inch.

Figure 2:
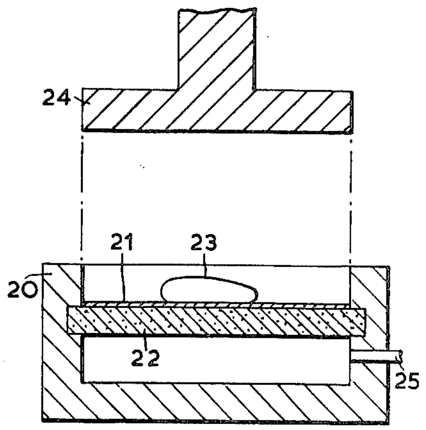
FIG. 2 shows a modification of the method of FIG. 1.

In a modification of the pressing process of FIG. 1, to be described with reference to FIG. 2, the metal foil is inserted into a mould 20 incorporating a porous base 22. The base may consist of a steel plate drilled with large numbers of fine holes or it may be a sintered metal plate. The body of the mould 20 is hollow and is connected as shown at 25 to a vacuum pump, so that when the metal foil 21 is placed on the porous base 22 it is sucked down into close contact with it. This ensures that the foil remains flat during the pressing operation and also ensures good thermal contact between the foil 21 and the base 22. The other steps in this process may be identical with those described above.

Figure 3:
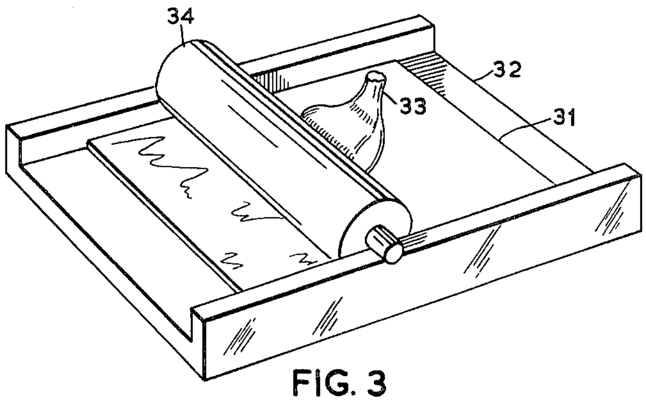
FIG. 3 shows a second method in accordance with the invention.

Another modification of the process, to be described with reference to FIG. 3, involves the use of a roller in place of the plunger described. This is specially applicable when plates are required of a larger area than can conveniently be made by pressing. The metal foil 31 is placed on the base 32 of the rolling apparatus, which again can be provided with means for sucking down the foil as described above. A stream of molten glass 33 is poured on to the foil immediately in front of a heavy steel roller 34 which moves forward as the glass is poured and rolls the glass into a thin sheet and at the same time presses the glass into close contact with the foil 31. Here again a rapid time cycle is employed and the bonded metal-glass plate is rapidly transferred to an annealing furnace (or direct to the heat-treatment furnace) on completion of the rolling operation. The other steps in this process may be as described above.

What we claim as our invention and desire to secure by Letters Patent is:

1. A bonded metal-ceramic element consisting of a metal component formed of a metal selected from the group consisting of silver, silver-based alloy, copper, copper-based alloy, and nickel, bonded directly to a base consisting of a devitrified glass component having a composition within the following range in percentage by weight and having a coefficient of thermal expansion in the devitrified state in the range 20–400° C. of between 135 and $175 \times 10^{-7}$.

| | Percent |
|---|---|
| $SiO_2$ | 50–80 |
| PbO | 0–30 |
| $Al_2O_3$ | 0–3 |
| ZnO | 5–30 |
| $Li_2O$ | 5–15 |
| $B_2O_3$ | 0–7 |
| $K_2O$ | 0–5 |
| $Na_2O$ | 0–5 |
| $P_2O_5$ | 1–3 |

2. A bonded metal-ceramic element as claimed in claim 1 wherein said composition comprises PbO within the range 0.5 to 30 percent by weight.

3. A bonded metal-ceramic element as claimed in claim 1 wherein the metal component has a coating of nickel, at least on that part to which the devitrified glass base is bonded.

4. A bonded metal-ceramic element consisting of a metal component, formed of a metal selected from the group consisting of silver and silver-based alloy, directly bonded to a base consisting of a devitrified glass component having a composition within the following range in percentage by weight and having a coefficient of thermal expansion in the devitrified state of between 170 and 135 and $175 \times 10^{-7}$:

| | Percent |
|---|---|
| $SiO_2$ | 50–80 |
| PbO | 0–30 |
| $Al_2O_3$ | 0–3 |
| ZnO | 5–30 |
| $Li_2O$ | 5–15 |
| $B_2O_3$ | 0–7 |
| $K_2O$ | 0–5 |
| $Na_2O$ | 0–5 |
| $P_2O_5$ | 1–3 |

5. A bonded metal-ceramic element consisting of a metal component, formed of a metal selected from the group consisting of copper and copper-based alloy, directly bonded to a base consisting of a devitrified glass component having a composition within the following range in percentage by weight and having a coefficient of thermal expansion in the devitrified state of between 147 and $175 \times 10^{-7}$:

| | Percent |
|---|---|
| $SiO_2$ | 50–80 |
| PbO | 0–30 |
| $Al_2O_3$ | 0–3 |
| ZnO | 5–30 |
| $Li_2O$ | 5–15 |
| $B_2O_3$ | 0–7 |
| $K_2O$ | 0–5 |
| $Na_2O$ | 0–5 |
| $P_2O_5$ | 1–3 |

References Cited by the Examiner

UNITED STATES PATENTS

| | | | |
|---|---|---|---|
| 1,587,742 | 6/1926 | Avery | 29—195 |
| 1,989,236 | 1/1935 | Laise | 29—472.5 |
| 2,335,376 | 11/1943 | Ballintine | 189—36.5 |
| 2,523,155 | 9/1950 | Shoup | 189—36.5 |
| 2,534,392 | 12/1950 | Walsh | 29—472.9 |
| 2,555,877 | 6/1951 | Doran | 189—36.5 |
| 2,570,248 | 10/1951 | Kelley | 189—36.5 X |
| 2,724,892 | 11/1955 | Knochel | 29—472.9 |
| 2,848,801 | 8/1958 | Eber | 29—472.9 |
| 2,889,952 | 6/1959 | Claypoole | 65—69 |
| 2,920,971 | 1/1960 | Stookey | 106—39 |
| 3,061,664 | 10/1962 | Kegg | 65—33 |
| 3,075,860 | 1/1963 | Veres | 65—33 X |
| 3,107,757 | 10/1963 | Breadner | 189—36.5 |

DAVID L. RECK, *Primary Examiner.*

HYLAND BIZOT, *Examiner.*